US012617973B2

(12) United States Patent
Byun et al.

(10) Patent No.: US 12,617,973 B2
(45) Date of Patent: May 5, 2026

(54) SLURRY COMPOSITIONS FOR POLISHING METAL LAYERS, CHEMICAL MECHANICAL POLISHING APPARATUSES USING THE SAME, AND METHODS FOR FABRICATING SEMICONDUCTOR DEVICES USING THE SAME

(71) Applicant: Samsung Electronics Co., Ltd., Suwon-si (KR)

(72) Inventors: Yea Rin Byun, Hwaseong-si (KR); In Kwon Kim, Hwaseong-si (KR); Sang Kyun Kim, Hwaseong-si (KR); Hyo San Lee, Seongnam-si (KR); Byung Keun Hwang, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 537 days.

(21) Appl. No.: 18/060,120

(22) Filed: Nov. 30, 2022

(65) Prior Publication Data

US 2023/0193080 A1    Jun. 22, 2023

(30) Foreign Application Priority Data

Dec. 21, 2021    (KR) ........................ 10-2021-0183723

(51) Int. Cl.
| | |
|---|---|
| *C09G 1/02* | (2006.01) |
| *B24B 37/04* | (2012.01) |
| *H01L 21/321* | (2006.01) |

(52) U.S. Cl.
CPC .............. *C09G 1/02* (2013.01); *B24B 37/044* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 5,228,886 A | 7/1993 | Zipperian | |
| 9,120,952 B2 | 9/2015 | Gupta et al. | |

| | | | | |
|---|---|---|---|---|
| 9,567,491 B2 | 2/2017 | Fu et al. | |
| 11,471,999 B2 * | 10/2022 | Kumar | .................... B24D 11/04 |
| 2008/0277378 A1 * | 11/2008 | Babu | ................... H01L 21/3212 |
| | | | 216/53 |
| 2009/0250404 A1 * | 10/2009 | Berkowitz | .............. C02F 1/725 |
| | | | 977/773 |
| 2009/0261042 A1 * | 10/2009 | Semiat | ................. B01J 20/3433 |
| | | | 977/773 |
| 2011/0039412 A1 * | 2/2011 | Park | .................... H01L 21/3212 |
| | | | 438/693 |
| 2012/0077419 A1 * | 3/2012 | Zhang | .................. C09K 3/1445 |
| | | | 977/773 |
| 2016/0280962 A1 * | 9/2016 | Zhou | ........................ C09G 1/02 |
| 2019/0127607 A1 * | 5/2019 | Rose | .................... C09K 3/1445 |

FOREIGN PATENT DOCUMENTS

| | | |
|---|---|---|
| JP | 2013247329 A | 12/2013 |
| KR | 10-1999-0014245 A | 2/1999 |
| KR | 10-2000-0076877 A | 12/2000 |
| KR | 20010058992 A | 7/2001 |
| KR | 20050092953 A | 9/2005 |
| KR | 10-2008-0070053 A | 7/2008 |
| KR | 20110012450 A | 2/2011 |

OTHER PUBLICATIONS

[No Author Listed], Thermal Conductivity of Common Oxides. Online platform, Matmake.com (Retrieved from: https://matmake.com/properties/thermal-conductivity-of-oxides.html). Aug. 2024; 1 page.

* cited by examiner

*Primary Examiner* — Allan W. Olsen
(74) *Attorney, Agent, or Firm* — Wolf, Greenfield & Sacks, P.C.

(57)    ABSTRACT

Slurry compositions for chemical mechanical polishing, chemical mechanical polishing apparatuses using the same, and methods for fabricating a semiconductor device using the same are provided. The slurry composition for chemical mechanical polishing may include polishing particles in an amount of 0.1% to 10% by weight of the slurry composition, an oxidant in an amount of 0.1% to 5% by weight of the slurry composition, a thermo-sensitive agent in an amount of 0.01% to 30% by weight of the slurry composition. The thermo-sensitive agent may include metal nanoparticles or metal oxide nanoparticles, and water, wherein the slurry composition has a pH of 1 to 8.

18 Claims, 4 Drawing Sheets

SLURRY COMPOSITIONS FOR POLISHING METAL LAYERS, CHEMICAL MECHANICAL POLISHING APPARATUSES USING THE SAME, AND METHODS FOR FABRICATING SEMICONDUCTOR DEVICES USING THE SAME

CROSS-REFERENCE TO RELATED APPLICATION

This application claims priority to Korean Patent Application No. 10-2021-0183723, filed on Dec. 21, 2021, and all the benefits accruing therefrom under 35 U.S.C. § 119, the disclosure of which is incorporated herein by reference in its entirety.

BACKGROUND

The present inventive concept relates to a slurry composition for chemical mechanical polishing, a chemical mechanical polishing apparatus using the same, and a method for fabricating a semiconductor device using the same. More specifically, the present inventive concept relates to a temperature-sensitive slurry composition for chemical mechanical polishing, a chemical mechanical polishing apparatus using the same, and a method for fabricating a semiconductor device using the same.

In a fabricating process of a semiconductor device, a chemical mechanical polishing (CMP) process is widely used as a flattening technique for removing a step between films formed on a substrate. The chemical mechanical polishing process may efficiently flatten or planarize the films formed on the substrate, by injecting polishing slurry including polishing particles between a substrate and a polishing pad, and rubbing the substrate and the polishing pad against each other.

On the other hand, in the chemical mechanical polishing process based on a chemical reaction, a change in polishing temperature may cause a change in the polishing characteristics of the chemical mechanical polishing process. Therefore, methods capable of efficiently controlling the polishing temperature to achieve the required polishing characteristics are being studied.

SUMMARY

Aspects of the present inventive concept provide a slurry composition for chemical mechanical polishing that improves productivity and uniformity of the chemical mechanical polishing process.

Aspects of the present inventive concept also provide a chemical mechanical polishing apparatus that improves the productivity and uniformity of the chemical mechanical polishing process.

Aspects of the present inventive concept also provide a method for fabricating a semiconductor device having improved productivity and uniformity.

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

According to an aspect of the present inventive concept, there is provided a slurry composition for chemical mechanical polishing comprising polishing particles in an amount of 0.1% to 10% by weight of the slurry composition, an oxidant in an amount of 0.1% to 5% by weight of the slurry composition, a thermo-sensitive agent in an amount of 0.01% to 30% by weight of the slurry composition, the thermo-sensitive agent including metal nanoparticles or metal oxide nanoparticles, and water, wherein the slurry composition has a pH of 1 to 8.

According to an aspect of the present inventive concept, there is provided a slurry composition for chemical mechanical polishing comprising polishing particles including metal oxide, an oxidant including a peroxide compound, a pH adjuster, a thermo-sensitive agent including metal nanoparticles or metal oxide nanoparticles having a thermal conductivity of 15 W/(m·K) or higher, and water.

According to an aspect of the present inventive concept, there is provided a method for fabricating a semiconductor device, the method comprising forming a metal film on a semiconductor substrate, and performing a chemical mechanical polishing process on the metal film, using a slurry composition for chemical mechanical polishing, wherein the slurry composition for chemical mechanical polishing includes polishing particles, an oxidant, a thermo-sensitive agent including metal nanoparticles or metal oxide nanoparticles having a thermal conductivity of 15 W/(m·K) or higher, and water, wherein the slurry composition has a pH of 1 to 8.

BRIEF DESCRIPTION OF THE DRAWINGS

The above and other aspects and features of the present inventive concept will become more apparent by describing in detail some example embodiments thereof with reference to the attached drawings, in which.

DETAILED DESCRIPTION

Figure 1:
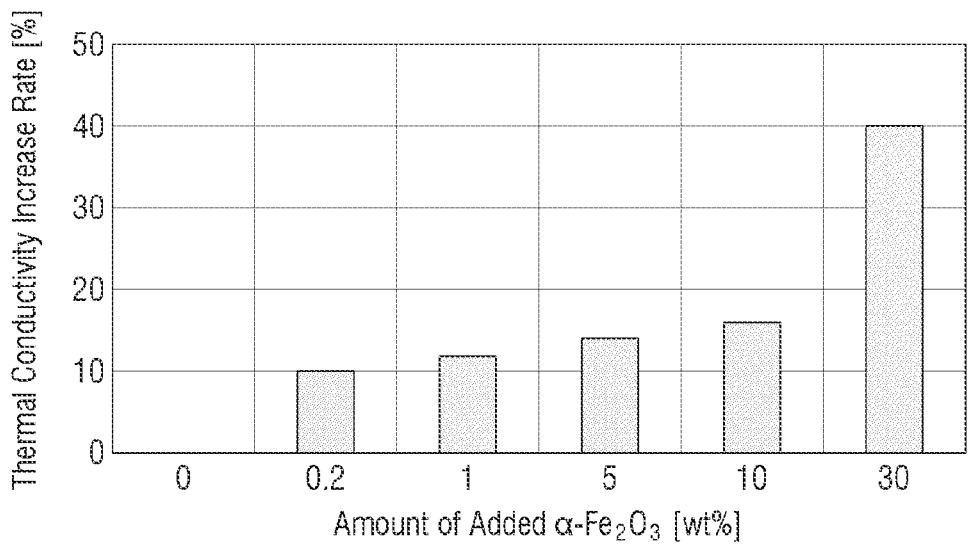
FIG. 1 is a graph explaining the change in the thermal conductivity increase rate with the concentration of $\alpha$-Fe$_2$O$_3$ for a slurry composition for chemical mechanical polishing.

Hereinafter, slurry compositions for chemical mechanical polishing according to some embodiments of the present inventive concept will be described.

The slurry composition for chemical mechanical polishing according to some embodiments includes polishing particles, an oxidant, a pH adjuster, a thermo-sensitive agent, and a solvent.

The polishing particles may function as an abrasive. The polishing particles may include metal oxides, metal oxides coated with an organic material or an inorganic material, or metal oxides in colloidal form. For example, the polishing particles may include, but are not limited to, at least one of silica, alumina, ceria, titania, zirconia, magnesia, germania, mangania, and combinations thereof. In an example, the polishing particles may include colloidal silica.

The shape of the polishing particles may be various shapes, such as a spherical shape, a square shape, a needle shape or a plate shape.

An average size (e.g., an average particle size) of the polishing particles may be from about 10 nm to about 300 nm. If the size of the polishing particles is less than about 10 nm, a polishing rate for a polishing target film may decrease. If the size of the polishing particles exceeds about 300 nm, surface defects may occur in the polishing target film, and it may be difficult to adjust a polishing selection ratio.

The polishing particles may include particles of a single size, but, in some embodiments, may include a mixture of two or more types of particles (e.g., particles having different sizes). For example, the polishing particles may have a particle size distribution of a bimodal form in which the size is adjusted and the two types of particles are mixed in the fabricating process. Alternatively, the polishing particles may have a particle size distribution in which three types of particles are mixed and exhibit three peaks. When polishing particles of relatively large size and polishing particles of relatively small size are mixed, remarkable dispersibility may be obtained. In addition, such polishing particles may reduce scratches on the polishing target.

The polishing particles may be present in an amount of about 0.1% to about 10% by weight of the slurry composition for chemical mechanical polishing. When the polishing particles are present at less than about 0.1% by weight, the polishing rate of the polishing target film may decrease. When the polishing particles are present at more than about 10% by weight, surface defects may occur in the polishing target film, and it may be difficult to adjust the polishing selection ratio.

The oxidant may have a higher oxidation/reduction potential than the polishing target film (for example, a metal film). As a result, the oxidant may improve the polishing rate on the polishing target film by oxidizing the polishing target film. The oxidant may include peroxide and/or peroxide compounds. For example, the oxidant may include, but is not limited to, at least one of hydrogen peroxide ($H_2O_2$), hydrogen peroxide-urea, performic acid, peracetic acid, potassium periodate ($KIO_4$), ammonium peroxymonosulfate, potassium permanganate ($KClO_4$), potassium perbromate ($KBrO_4$), potassium permanganate ($KMnO_4$), and combinations thereof. In an example, the oxidant may include hydrogen peroxide.

The oxidant may be present in an amount of about 0.1% to about 5% by weight of the slurry composition for chemical mechanical polishing. When the oxidant is present at less than about 0.1% by weight, the polishing rate on the polishing target film may decrease. When the oxidant is present at more than about 5% by weight, excessive oxidative etching may occur and the flatness or smoothness of the polishing target film may decrease.

The pH adjuster may adjust the pH of the slurry composition for chemical mechanical polishing. The pH adjuster may include, for example, but is not limited to, a basic solution such as lithium hydroxide (LiOH), sodium hydroxide (NaOH), potassium hydroxide (KOH), and cesium hydroxide (CsOH), and/or an acid solution such as sulfuric acid ($H_2SO_4$), nitric acid ($HNO_3$), hydrochloric acid (HCl), and phosphoric acid ($H_3PO_4$). The pH adjuster may be added in an amount necessary for adjusting the pH required in the slurry composition for chemical mechanical polishing, but is not particularly limited.

In some embodiments, a pH of the slurry composition for chemical mechanical polishing may be adjusted to about 1 to about 8. For example, a pH of the slurry composition for chemical mechanical polishing may be in a range of about 1 to about 4. When a pH of the slurry composition for chemical mechanical polishing exceeds 8, the polishing efficiency may decrease.

The thermo-sensitive agent may improve the thermo-sensitivity of the slurry composition for chemical mechanical polishing. The thermo-sensitive agent may include metallic nanoparticles or metal oxide nanoparticles having a relatively higher thermal conductivity than other constituents. In some embodiments, the thermal conductivity of the thermo-sensitive agent may be about 15 W/(m·K) or higher. As an example, the thermal conductivity of the thermo-sensitive agent may be from about 15 W/(m·K) to about 1,000 W/(m·K).

For example, the thermo-sensitive agent may include, but is not limited to, at least one of silver (Ag) nanoparticles, copper (Cu) nanoparticles, gold (Au) nanoparticles, aluminum (Al) nanoparticles, nickel (Ni) nanoparticles, iron (Fe) nanoparticles, beryllium oxide (BeO) nanoparticles, triiron tetroxide ($Fe_3O_4$) nanoparticles, diiron trioxide ($Fe_2O_3$) nanoparticles, and combinations thereof. For example, the thermo-sensitive agent may include alpha iron oxide ($\alpha$-$Fe_2O_3$) nanoparticles.

An average size of the metal nanoparticles or an average size of the metal oxide nanoparticles may be about 100 nm or less. For example, the average size of the metal nanoparticles or the average size of the metal oxide nanoparticles may be, but is not limited to, from about 1 nm to about 20 nm.

The thermo-sensitive agent may be present in an amount of about 0.01% to about 30% by weight of the slurry composition for chemical mechanical polishing. When the thermo-sensitive agent is present at more than about 0.01% by weight, because the thermo-sensitivity of the slurry composition for chemical mechanical polishing is improved, the polishing time of the chemical mechanical polishing process may be shortened, and the flatness of the polishing target film may be improved. When the thermo-sensitive agent is present at more than about 30% by weight, the polishing rate of the polishing target film may decrease. In some embodiments, preferably, the thermo-sensitive agent may be present in an amount of about 0.01% to about 10% by weight of the slurry composition for chemical mechanical polishing.

The solvent may include water. In some embodiments, preferably, the solvent may include deionized water (i.e., DI water). Although the solvent may function as the solvent and a dispersion medium at the same time, it is referred to as a solvent in the present specification for convenience. For example, the solvent may function as a solvent in relation to an easily soluble material such as the oxidant, but may function as a dispersion medium in relation to fine particles such as the polishing particles.

The solvent may be included in the remainder of the slurry composition for chemical mechanical polishing.

In some embodiments, the slurry composition for chemical mechanical polishing may have a thermal conductivity of about 0.5 W/(m·K) or higher. For example, the thermal conductivity of the slurry composition for chemical mechanical polishing may be from about 0.5 W/(m$\alpha$K) to about 1.0 W/(m·K).

In some embodiments, the slurry composition for chemical mechanical polishing may be a slurry composition for metal film polishing. The metal film may include, for example, but is not limited to, at least one of tungsten (W), copper (Cu), ruthenium (Ru), molybdenum (Mo), aluminum (Al), platinum (Pt), and combinations thereof.

In some embodiments, the slurry composition for chemical mechanical polishing may further include a catalyst. The catalyst may accelerate the polishing rate on the polishing target film (for example, a metal film).

For example, the catalyst may include iron (Fe)-containing compound. The iron-containing compound may include, for example, but is not limited to, at least one of iron halides such iron nitrate, iron sulfate, iron fluoride, iron chloride, iron bromide, iron iodide, iron perchlorate, iron perbromate and iron periodate; organic iron compounds such as iron acetate, iron acetylacetonate, iron citrate, iron gluconate, iron malonate, iron oxalate, iron phthalate, iron and succinate, and combinations thereof. For example, the catalyst may include iron (III) nitrate (Fe(NO$_3$)$_3$).

The catalyst may be present in an amount of about 0.1% to about 1% by weight of the slurry composition for chemical mechanical polishing.

In some embodiments, the slurry composition for chemical mechanical polishing may further include an inhibitor. The inhibitor may limit the polishing rate of the polishing target film (for example, a metal film).

For example, the inhibitor may include a nitrogen-containing compound. The nitrogen-containing compound may include, for example, but is not limited to, a least one of amine; nitrogen-containing heterocyclic compound such as benzotriazole, 1,2,3-triazole, and 1,2,4-triazole, and combinations thereof.

The inhibitor may be present in an amount of from about 0.1% to about 1% by weight of the slurry composition for chemical mechanical polishing.

In some embodiments, the slurry composition for chemical mechanical polishing may further include a stabilizer. The stabilizer may ensure the stability of the slurry composition for chemical mechanical polishing, by reducing the reaction between the oxidant and the catalyst, and the decomposition of the oxidant.

For example, the stabilizer may include an acidic compound. The acidic compound may include, for example but is not limited to, at least one of phosphoric acid, acetic acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid (EDTA), propylenediaminetetraacetic acid, conjugate base thereof, and combinations thereof.

The stabilizer may be present in an amount of about 0.1% to about 1% by weight of the slurry composition for chemical mechanical polishing.

In some embodiments, the slurry composition for chemical mechanical polishing may further include a biocide. The biocide may include, for example, but is not limited to, isothiazolinone.

The biocide may be present in an amount of from about 1 ppm to about 20 ppm.

Hereinafter, slurry compositions for chemical mechanical polishing according to some example embodiments of the present inventive concept will be described more specifically with reference to the following examples, the following comparative examples, and FIGS. 1 and 2. The following examples are merely examples, and the present disclosures are not limited to these examples.

Example 1

Silica having an average size of 100 nm as the polishing particles in an amount of 3.0% by weight of a slurry composition, hydrogen peroxide (H$_2$O$_2$) as the oxidant in an amount of 4.0% by weight of the slurry composition, alpha iron oxide ($\alpha$-Fe$_2$O$_3$) nanoparticles as the thermo-sensitive agent in an amount of 0.2% by weight of the slurry composition, and 20 ppm of iron (III) nitrate (Fe(NO$_3$)$_3$) as the catalyst were mixed with deionized water to produce a slurry composition for chemical mechanical polishing having a pH of 2.3.

Example 2

A slurry composition for chemical mechanical polishing was produced in the same manner as in Example 1 except that the thermo-sensitive agent was present in amount of 1.0% by weight of the slurry composition.

Example 3

A slurry composition for chemical mechanical polishing was produced in the same manner as in Example 1 except that the thermo-sensitive agent was present in an amount of 5.0% by weight of the slurry composition.

Example 4

A slurry composition for chemical mechanical polishing was produced in the same manner as in Example 1 except that the thermo-sensitive agent was present in an amount of 10% by weight of the slurry composition.

Example 5

A slurry composition for chemical mechanical polishing was produced in the same manner as in Example 1 except that the thermo-sensitive agent was present in an amount of 30% by weight of the slurry composition.

Comparative Example

A slurry composition for chemical mechanical polishing was produced in the same manner as in Example 1 except that no thermo-sensitive agent was added.
[Evaluation of Thermal Conductivity]

The thermal conductivity of the slurry composition for chemical mechanical polishing produced according to Examples 1 to 5 and Comparative Example was measured and shown in Table 1 below.

TABLE 1

| | Thermal Conductivity [W/(m · K)] |
|---|---|
| Example 1 | 0.53 |
| Example 2 | 0.54 |
| Example 3 | 0.55 |
| Example 4 | 0.56 |
| Example 5 | 0.67 |
| Comparative Example | 0.48 |

Referring to Table 1 above, it may be confirmed that as the addition amount of the thermo-sensitive agent ($\alpha$-Fe$_2$O$_3$ nanoparticles) increases, the thermal conductivity of the slurry composition for chemical mechanical polishing increases.

Further, a rate of increase in thermal conductivity of the slurry composition for chemical mechanical polishing according to the concentration of the thermo-sensitive agent is shown in FIG. 1 on the basis of the above Table 1.

Specifically, FIG. 1 is a graph explaining the change in the thermal conductivity increase rate with the concentration of $\alpha$-Fe$_2$O$_3$ for a slurry composition for chemical mechanical polishing.

Referring to Table 1 and FIG. 1, it may be confirmed that the slurry composition for chemical mechanical polishing produced according to Examples 1 to 5 exhibit a thermal conductivity (for example, the thermal conductivity of about 0.53 W/(m·K) or higher) increase of about 10% or more compared with the slurry composition for chemical mechanical polishing produced according to the Comparative example.

[Thermo-Sensitivity Evaluation]

Figure 2:
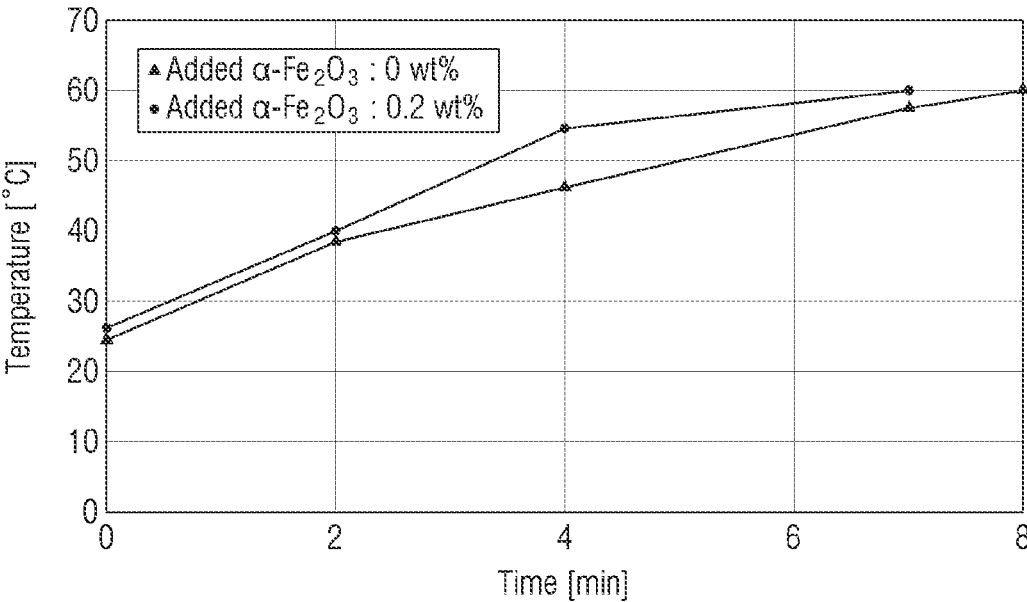
FIG. 2 is a graph explaining the change in temperature over time for slurry compositions for chemical mechanical polishing based on the concentration of $\alpha$-Fe$_2$O$_3$.

The temperature changes of the slurry composition for chemical mechanical polishing produced according to above Example 1 and the Comparative example were each measured and shown in FIG. 2. Specifically, FIG. 2 is a graph explaining the change in temperature over time for slurry compositions for chemical mechanical polishing based on the concentration of $\alpha$-Fe$_2$O$_3$.

Referring to FIG. 2, when reaching about 60° C., the slurry composition for chemical mechanical polishing ($\alpha$-Fe$_2$O$_3$ addition amount: 0% by weight) produced according to the Comparative example took about 8 minutes, and the slurry composition for chemical mechanical polishing ($\alpha$-Fe$_2$O$_3$ addition amount: 0.2% by weight) produced according to the Example 1 took about 7 minutes. That is, as compared with the slurry composition for chemical mechanical polishing produced according to the Comparative example, it may be confirmed that the slurry composition for chemical mechanical polishing produced according to the Example 1 exhibits a thermo-sensitivity increase of about 12.5% (for example, the temperature increase rate), by including the thermo-sensitive agent.

In the chemical mechanical polishing process based on the chemical reaction, the polishing temperature causes a change in polishing characteristics of the chemical mechanical polishing process. For example, at the beginning of the polishing process, a low polishing temperature may reduce a unit per equipment hour (UPEH), and a predetermined polishing temperature may be required to achieve the required unit per equipment hour. However, as the polishing process progresses, the polishing temperature may rise due to a friction between the wafer and the polishing pad, and such a change in the polishing temperature has a problem of lowering the polishing uniformity. Therefore, a method capable of efficiently controlling the polishing temperature to achieve the required polishing characteristics is being studied.

The slurry composition for chemical mechanical polishing according to some embodiments may efficiently control the polishing temperature by including the thermo-sensitive agent. Specifically, as described above with reference to Tables 1, and FIGS. 1 and 2 above, since the slurry composition for chemical mechanical polishing according to some embodiments may have improved thermo-sensitivity (e.g., the thermal conductivity of about 0.5 W/(m·K) or more) by including the thermo-sensitive agent, the slurry composition may be rapidly heated or cooled to the required polishing temperature. Accordingly, the slurry composition for chemical mechanical polishing according to some embodiments may provide improved productivity and uniformity in the chemical mechanical polishing process.

Hereinafter, with reference to FIG. 3, a chemical mechanical polishing apparatus using the slurry composition for chemical mechanical polishing according to some embodiments of the present inventive concept will be described.

Figure 3:
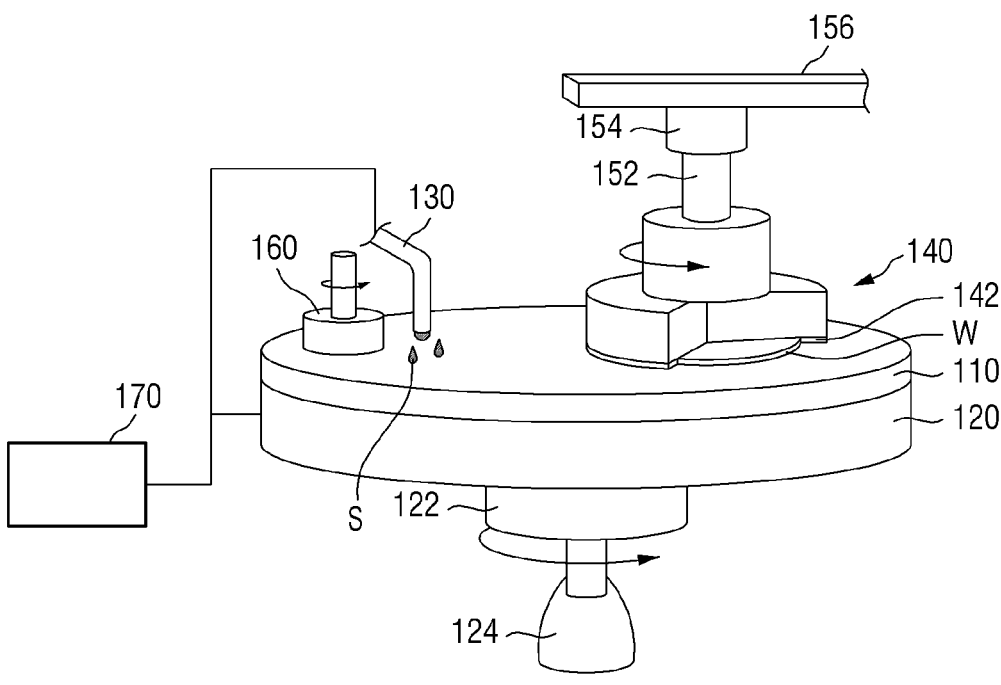
FIG. 3 is a schematic perspective view for explaining the chemical mechanical polishing apparatus according to some embodiments.

FIG. 3 is a schematic perspective view for explaining the chemical mechanical polishing apparatus according to some embodiments. The chemical mechanical polishing apparatus according to FIG. 3 is merely an example, and the present disclosure is not limited to such an apparatus.

Referring to FIG. 3, the chemical mechanical polishing apparatus according to some embodiments includes a polishing pad 110, a platen 120, a slurry supply unit 130, a carrier head assembly 140, a pad conditioner 160, and a temperature controller 170.

The polishing pad 110 may be placed on the platen 120. The polishing pad 110 may be provided as a plate having a certain thickness, for example, a circular plate, but is not limited thereto. The polishing pad 110 may include a polishing surface having a predetermined roughness. While the chemical mechanical polishing process is being performed, a polishing surface of the polishing pad 110 may come into contact with a wafer W to polish the wafer W.

The polishing pad 110 may include a porous material having a plurality of microspaces. The microspaces of the polishing pad 110 may accommodate the polishing slurry S provided while the chemical mechanical polishing process is being performed. The polishing pad 110 may include, for example, but is not limited to, polyurethane pad.

In some embodiments, the polishing pad 110 may further include a conductive material. The polishing pad 110, which is a conductor, may be grounded to reduce or prevent an occurrence of a short circuit. In some other embodiments, the polishing pad 110 may be a non-conductor.

The platen 120 may be rotatable. The rotatable platen 120 may rotate the polishing pad 110 placed on the platen 120. For example, a first drive shaft 122 connected to a lower part of the platen 120 may rotate by receiving a rotational power from a first motor 124. Such a platen 120 may rotate the polishing pad 110 about a rotation axis perpendicular to an upper surface of the platen 120.

The slurry supply unit 130 may be placed to be adjacent to the polishing pad 110. While the chemical mechanical polishing process is being performed, the slurry supply unit 130 may supply the polishing slurry S onto the polishing pad 110. The polishing slurry S may include the above-mentioned slurry composition for chemical mechanical polishing. For example, the polishing slurry S may include polishing particles, an oxidant, a pH adjuster, a thermo-sensitive agent, and a solvent.

The carrier head assembly 140 may be placed to be adjacent to the polishing pad 110. The carrier head assembly 140 may provide the wafer W onto the polishing pad 110. The carrier head assembly 140 may operate to hold the wafer W against the polishing pad 110. The carrier head assembly 140 may independently control the polishing parameters (e.g., pressure, etc.) associated with each wafer W.

For example, the carrier head assembly 140 may include a retaining ring 142 for holding the wafer W under the flexible membrane. Such a carrier head assembly 140 may include multiple pressurizable chambers that are defined by the flexible membrane and independently controllable. The pressurizable chambers may apply independently controllable pressure to the related zones on the flexible membrane or the related zones on the wafer W.

The carrier head assembly 140 may be rotatable. The rotatable carrier head assembly 140 may rotate the wafer W fixed to the carrier head assembly 140. For example, the second drive shaft 152 connected to the upper part of the carrier head assembly 140 may rotate by receiving the rotational power from the second motor 154.

The carrier head assembly 140 may be supported by a support structure 156. The support structure 156 may be, for example, but is not limited to, a carousel or a track. In some embodiments, the carrier head assembly 140 may be laterally translated across the upper surface of the polishing pad 110. For example, the carrier head assembly 140 may be vibrated on a slider of the support structure 156, or by rotational vibration of the support structure 156 itself.

Although FIG. 3 shows only one carrier head assembly 140 provided on the polishing pad 110, this is provided as only an example. In some embodiments, a plurality of carrier head assemblies 140 may be provided on the polishing pad 110 to efficiently use the surface area of the polishing pad 110. Although FIG. 3 only shows that the rotation direction of the platen 120 and the rotation direction of the carrier head assembly 140 are the same as each other, this is provided as only an example, and they may, of course, rotate in different rotation directions from each other.

The pad conditioner 160 may be placed to be adjacent to the polishing pad 110. The pad conditioner 160 may perform a conditioning process on the polishing pad 110. The pad conditioner 160 may stably hold the polishing surface of the polishing pad 110 so that the wafer W is effectively polished during the chemical mechanical polishing process.

The temperature controller 170 may control the polishing temperature at which the chemical mechanical polishing process is performed on the wafer W. For example, the temperature controller 170 may be connected to the platen 120 to heat or cool the temperature of the polishing pad 110 placed on the platen 120. Alternatively, for example, the temperature controller 170 may be connected to the slurry supply unit 130 to heat or cool the temperature of the polishing slurry S supplied from the slurry supply unit 130. The temperature controller 170 may include, for example, but is not limited to, a temperature controlling device and the like.

The chemical mechanical polishing apparatus according to some embodiments may efficiently control the polishing temperature by utilizing the above-mentioned slurry composition for chemical mechanical polishing. Specifically, since the polishing slurry S supplied from the slurry supply unit 130 may have improved thermo-sensitivity by including the thermo-sensitive agent, the polishing slurry S may be quickly heated or cooled to the polishing temperature required when the polishing temperature is controlled by a temperature controller (for example, 170 of FIG. 3) or the like. Accordingly, the chemical mechanical polishing apparatus according to some embodiments may provide improved productivity and uniformity in the chemical mechanical polishing process.

Hereinafter, a method for fabricating a semiconductor device using the slurry composition for chemical mechanical polishing according to some embodiments of the present inventive concept will be described with reference to FIGS. 4 to 8.

FIGS. 4 to 8 are illustrating a method for fabricating the semiconductor device according to some embodiments. The method for fabricating semiconductor device according to FIGS. 4 to 8 is provided as merely an example, and the present disclosure is not limited to such a fabricating method.

Figure 4:
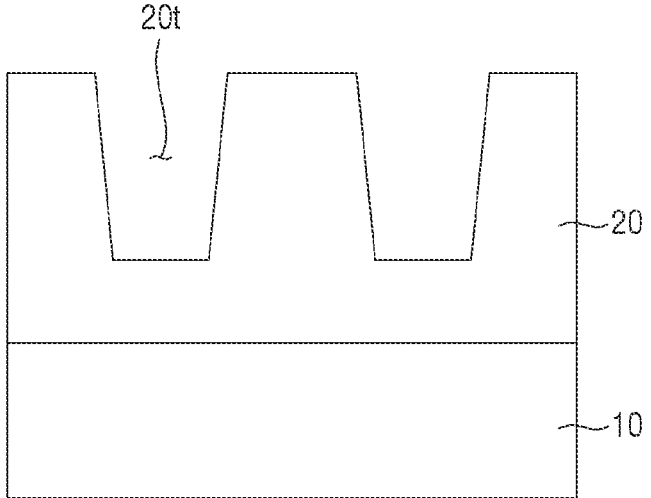
FIGS. 4 to 8 are intermediate step diagrams for explaining a method for fabricating the semiconductor device according to some embodiments.

Referring to FIG. 4, an interlayer insulating film 20 is formed on the semiconductor substrate 10.

The semiconductor substrate 10 may be, for example, bulk silicon or silicon-on-insulator (SOI). The semiconductor substrate 10 may be a silicon substrate or may include other materials, for example, silicon germanium, indium antimonide, lead tellurium compounds, indium arsenide, indium phosphide, gallium arsenide or gallium antimonide. In some embodiments, the semiconductor substrate 10 may be an epitaxial layer formed on the base substrate.

The interlayer insulating film 20 may include a trench 20t. For example, the trench 20t may be formed inside the interlayer insulating film 20 by performing an etching process on the interlayer insulating film 20. A width of the trench 20t may be, for example, about 20 nm or less. As an example, the width of the trench 20t may be from about 1 nm to about 15 nm. The interlayer insulating film 20 may include an insulating material, for example, but is not limited to, at least one of silicon oxide, silicon nitride, silicon oxynitride, and a combination thereof.

Figure 5:
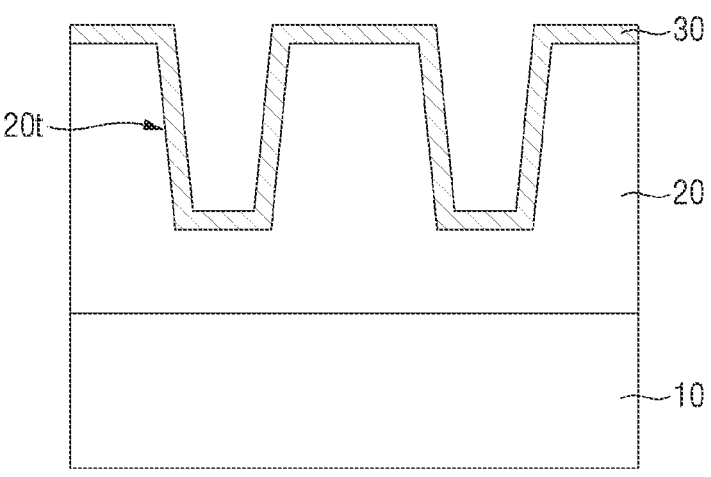

Referring to FIG. 5, a barrier film 30 is formed on the interlayer insulating film 20.

The barrier film 30 may extend along the profile of the interlayer insulating film 20 and the profile of the trench 20t. The barrier film 30 may include a metal or a metal nitride for reducing or preventing diffusion of metal film (40 of FIG. 6) to be described later. For example, the barrier film 30 may include, but is not limited to, at least one of titanium (Ti), tantalum (Ta), tungsten (W), nickel (Ni), cobalt (Co), platinum (Pt), alloys thereof, nitrides thereof, and combinations thereof.

Figure 6:
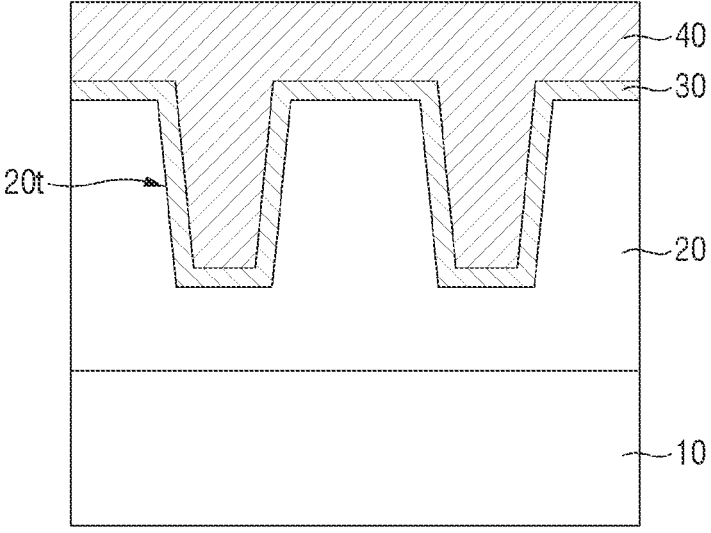

Referring to FIG. 6, the metal film 40 is formed on the barrier film 30.

The metal film 40 may cover the barrier film 30. The metal film 40 may fill a region of the trench 20t that remains after the barrier film 30 is filled. The metal film 40 may include a conductive material, for example, but is not limited to, at least one of tungsten (W), copper (Cu), ruthenium (Ru), molybdenum (Mo), aluminum (Al), platinum (Pt), and a combination thereof. As an example, the metal film 40 may include tungsten (W).

Figure 7:
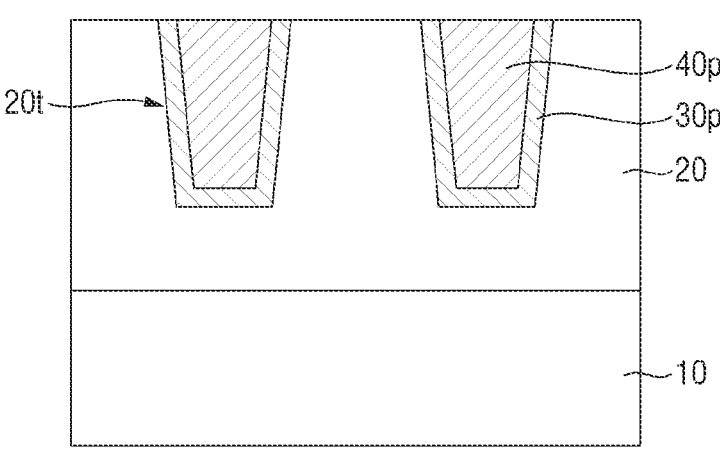

Referring to FIG. 7, a chemical mechanical polishing process is performed.

The chemical mechanical polishing process may use the above-mentioned slurry composition for chemical mechanical polishing. For example, the chemical mechanical polishing process may be performed by the chemical mechanical polishing apparatus described above with reference to FIG. 3.

As the chemical mechanical polishing process is performed, a barrier pattern 30p and a metal pattern 40p may be formed inside the interlayer insulating film 20. For example, the chemical mechanical polishing process may be performed until the uppermost surface of the interlayer insulating film 20 is exposed. The barrier pattern 30p and the metal pattern 40p may be sequentially stacked to fill the trench 20t. Such a metal pattern 40p may form a metal wiring of a semiconductor element, but is not limited thereto.

Figure 8:
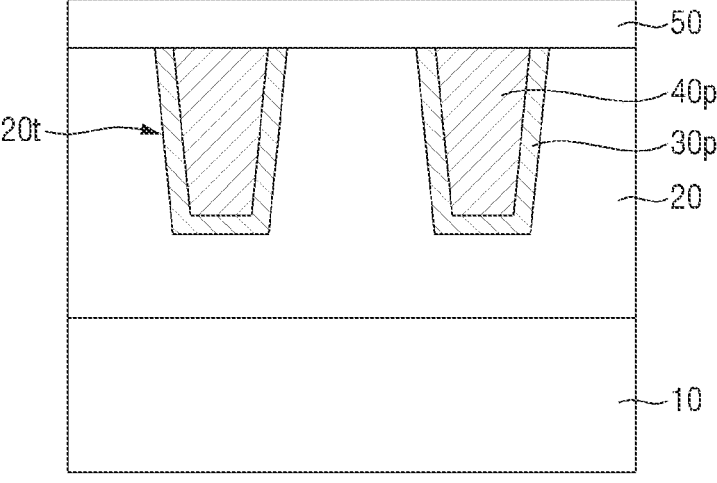

Referring to FIG. 8, a capping film 50 is formed.

The capping film 50 may cover the interlayer insulating film 20, the barrier pattern 30p, and the metal pattern 40p. The capping film 50 may include an insulating material, for example, but is not limited to, at least one of silicon nitride, silicon carbide, and combinations thereof. In some embodiments, the capping film 50 may be omitted.

The method of fabricating the semiconductor device according to some embodiments provides improved productivity and uniformity, by utilizing the slurry composition for chemical mechanical polishing described above. Specifically, since the above-mentioned slurry composition for chemical mechanical polishing may have improved thermo-sensitivity by including the above-mentioned temperature-sensitive agent, the improved productivity and uniformity can be provided in the chemical mechanical polishing process. Therefore, the method for fabricating the semiconductor device according to some embodiments may provide a semiconductor device having improved productivity and uniformity.

While the present inventive concept has been particularly shown and described with reference to some example embodiments thereof, it will be understood by those of ordinary skill in the art that various changes in form and details may be made therein without departing from the spirit and scope of the present inventive concept as defined by the following claims. It is therefore desired that embodiments be considered in all respects as illustrative and not restrictive, reference being made to the appended claims rather than the foregoing description to indicate the scope of the invention.

What is claimed is:

1. A slurry composition for chemical mechanical polishing, the slurry composition comprising:

polishing particles in an amount of 0.1% to 10% by weight of the slurry composition and including metal oxides;

an oxidant in an amount of 0.1% to 5% by weight of the slurry composition;

a thermo-sensitive agent in an amount of 0.01% to 30% by weight of the slurry composition, the thermo-sensitive agent including metal oxide nanoparticles having a thermal conductivity of 15 W/(m·K) or higher, wherein the thermo-sensitive agent comprises different particles from the polishing particles; and water, wherein the slurry composition has a pH of 1 to 8.

2. The slurry composition for chemical mechanical polishing of claim 1, wherein the thermo-sensitive agent has a thermal conductivity from 15 W/(m·K) to 1,000 W/(m·K).

3. The slurry composition for chemical mechanical polishing of claim 1, wherein the thermo-sensitive agent further includes at least one of silver (Ag) nanoparticles, copper (Cu) nanoparticles, gold (Au) nanoparticles, aluminum (Al) nanoparticles, nickel (Ni) nanoparticles, iron (Fe) nanoparticles, beryllium oxide (BeO) nanoparticles, triiron tetroxide ($Fe_3O_4$) nanoparticles, and diiron trioxide ($Fe_2O_3$) nanoparticles.

4. The slurry composition for chemical mechanical polishing of claim 3, wherein the thermo-sensitive agent includes alpha iron oxide ($\alpha$-$Fe_2O_3$) nanoparticles.

5. The slurry composition for chemical mechanical polishing of claim 1, wherein the polishing particles include at least one of silica, alumina, ceria, titania, zirconia, magnesia, germania, and mangania.

6. The slurry composition for chemical mechanical polishing of claim 1, wherein the oxidant includes at least one of hydrogen peroxide, hydrogen peroxide-urea, performic acid, peracetic acid, potassium periodate, ammonium peroxymonosulfate, potassium perchlorate, potassium perbromate, and potassium permanganate.

7. The slurry composition for chemical mechanical polishing of claim 1, further comprising:

a catalyst including an iron (Fe)-containing compound.

8. The slurry composition for chemical mechanical polishing of claim 7, wherein the catalyst includes iron (III) nitrate ($Fe(NO_3)_3$).

9. The slurry composition for chemical mechanical polishing of claim 1, further comprising:

an inhibitor including a nitrogen-containing compound.

10. The slurry composition for chemical mechanical polishing of claim 1, further comprising:

a stabilizer including an acidic compound.

11. The slurry composition for chemical mechanical polishing of claim 1, further comprising:

a biocide.

12. A slurry composition for chemical mechanical polishing, the slurry composition comprising:

polishing particles including metal oxide;

an oxidant including a peroxide compound;

a pH adjuster;

a thermo-sensitive agent including metal oxide nanoparticles having a thermal conductivity of 15 W/(m·K) or higher, wherein the thermo-sensitive agent comprises different particles from the polishing particles; and water.

13. The slurry composition for chemical mechanical polishing of claim 12, wherein the thermo-sensitive agent further includes at least one of silver (Ag) nanoparticles, copper (Cu) nanoparticles, gold (Au) nanoparticles, aluminum (Al) nanoparticles, nickel (Ni) nanoparticles, iron (Fe) nanoparticles, beryllium oxide (BeO) nanoparticles, triiron tetroxide ($Fe_3O_4$) nanoparticles, and diiron trioxide ($Fe_2O_3$) nanoparticles.

14. The slurry composition for chemical mechanical polishing of claim 12, wherein the polishing particles include colloidal silica.

15. The slurry composition for chemical mechanical polishing of claim 12, wherein the oxidant includes hydrogen peroxide.

16. The slurry composition for chemical mechanical polishing of claim 12, wherein the slurry composition has a pH of 1 to 8.

17. The slurry composition for chemical mechanical polishing of claim 12, wherein the slurry composition has a thermal conductivity of 0.5 W/(m·K) to 1.0 W/(m·K).

18. The slurry composition for chemical mechanical polishing of claim 12, wherein the slurry composition is a slurry composition for polishing a metal film.

* * * * *